(12) United States Patent
Snyder et al.

(10) Patent No.: US 6,829,190 B1
(45) Date of Patent: *Dec. 7, 2004

(54) METHOD AND SYSTEM FOR PROGRAMMING A MEMORY DEVICE

(75) Inventors: Warren Snyder, Snohomish, WA (US); Mark Rouse, Snohomish, WA (US)

(73) Assignee: Cypress Semiconductor Corporation, San Jose, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 10/653,050

(22) Filed: Aug. 29, 2003

Related U.S. Application Data

(63) Continuation of application No. 10/172,670, filed on Jun. 13, 2002, now Pat. No. 6,661,724.

(51) Int. Cl.[7] ................................................. G11C 7/00
(52) U.S. Cl. ................................. 365/211; 365/185.28
(58) Field of Search ........................... 365/211, 185.18, 365/185.28, 185.09

(56) References Cited

U.S. PATENT DOCUMENTS

| | | | |
|---|---|---|---|
| 4,138,671 A | 2/1979 | Comer et al. ............... | 340/347 |
| 4,656,603 A | 4/1987 | Dunn ......................... | 364/900 |
| 5,202,687 A | 4/1993 | Distinti ...................... | 341/158 |
| 5,258,760 A | 11/1993 | Moody et al. .............. | 341/166 |
| 5,414,308 A | 5/1995 | Lee et al. ................... | 327/293 |
| 5,426,378 A | 6/1995 | Ong ............................ | 326/39 |
| 5,563,526 A | 10/1996 | Hastings et al. ............. | 326/37 |
| 5,600,262 A | 2/1997 | Kolze .......................... | 326/38 |
| 5,633,766 A | 5/1997 | Hase et al. ................... | 360/51 |
| 5,703,871 A | 12/1997 | Pope et al. .................. | 370/248 |
| 5,828,693 A | 10/1998 | Mays et al. .................. | 375/202 |
| 5,880,598 A | 3/1999 | Duong ......................... | 326/41 |
| 5,939,949 A | 8/1999 | Olgaard et al. ............... | 331/17 |
| 6,018,559 A | 1/2000 | Azegami et al. .............. | 377/79 |
| 6,144,327 A | 11/2000 | Distinti et al. .............. | 341/126 |
| 6,157,270 A | 12/2000 | Tso ............................. | 331/176 |
| 6,166,367 A | 12/2000 | Cho ........................ | 250/208.1 |
| 6,191,660 B1 | 2/2001 | Mar et al. .................... | 331/111 |
| 6,225,866 B1 | 5/2001 | Kubota et al. .............. | 330/295 |
| 6,304,101 B1 | 10/2001 | Nishihara .................... | 326/41 |
| 6,449,761 B1 | 9/2002 | Greidinger et al. ........... | 716/11 |
| 6,460,172 B1 | 10/2002 | Insenser Farre et al. ...... | 716/17 |
| 2002/0099863 A1 | 7/2002 | Comeau et al. | |
| 2002/0144099 A1 | 10/2002 | Muro Jr. et al. | |
| 2002/0156929 A1 | 10/2002 | Hekmatpour | |
| 2002/0170050 A1 | 11/2002 | Fiorella, III et al. | |
| 2002/0183956 A1 | 12/2002 | Nightingale | |
| 2002/0188910 A1 | 12/2002 | Zizzo | |
| 2003/0038842 A1 | 2/2003 | Peck et al. | |

Primary Examiner—Tan T. Nguyen
(74) Attorney, Agent, or Firm—Wagner, Murabito & Hao LLP

(57) ABSTRACT

A method for programming a memory device is disclosed. In one method embodiment, the present invention receives a measurement from a temperature sensor located near a non-volatile programmable memory device. Next, a transformation is accessed. Then, the measurement from the temperature sensor is processed in conjunction with the transformation to establish a programming time for a memory device as a function of a programming voltage and the temperature of the memory device. The programming voltage is then applied to the memory device for the length of time specified by the programming time during the programming pulse of the memory device to accurately program the device using an optimum amount of current.

33 Claims, 16 Drawing Sheets

| TABLE ID | BYTE 0 | BYTE 1 | BYTE 2 | BYTE 3 | BYTE 4 | BYTE 5 | BYTE 6 | BYTE 7 |
|---|---|---|---|---|---|---|---|---|
| 7 | ERASE SLOPE [-40,0] C | ERASE INTERCEPT [-40,0] C | ERASE SLOPE [0,127] C | ERASE INTERCEPT [0,127] C | PROGRAM MULTIPLIER [-40,0] C | PROGRAM MULTIPLIER [0,127] C | 00 | REVISION 01 |

```
┌─────────────────────────────────────────────┐
│ PROVIDING AN INTERFACE FOR SELECTING APPLICABLE │
│ USER MODULES.                               │
│ 910                                         │
└─────────────────────────────────────────────┘
                      ↓
┌─────────────────────────────────────────────┐
│ GENERATING APPLICATION FILES AUTOMATICALLY. │
│ 920                                         │
└─────────────────────────────────────────────┘
                      ↓
┌─────────────────────────────────────────────┐
│ FACILITATING PROGRAMMING OF THE DESIRED     │
│ FUNCTIONALITY FOR A TARGET DEVICE.          │
│ 930                                         │
└─────────────────────────────────────────────┘
                      ↓
┌─────────────────────────────────────────────┐
│ EXECUTING AN ASSEMBLER PROCESS.             │
│ 940                                         │
└─────────────────────────────────────────────┘
                      ↓
┌─────────────────────────────────────────────┐
│ BUILDING A TARGET DEVICE WITHIN THE PSoC TOOL. │
│ 950                                         │
└─────────────────────────────────────────────┘
                      ↓
┌─────────────────────────────────────────────┐
│ EMULATING A TARGET DEVICE CONFIGURATION.    │
│ 960                                         │
└─────────────────────────────────────────────┘
                      ↓
┌─────────────────────────────────────────────┐
│ LOADING A CONFIGURATION IMAGE GENERATED BY THE │
│ PSoC TOOL INTO MEMORY OF A PSoC TARGET DEVICE. │
│ 970                                         │
└─────────────────────────────────────────────┘
```

TABLE 10

VR: A fixed bias applied to the sources of all SONOS FETs during any read modes.

Vem: An erased SONOS FET's ( or FETs' ) margin voltage, which correlates to a depletion FET's threshold voltage. It is the gate voltage (Vg) that triggers a small reference current in a bit line while the FET's source is held at fixed bias VR.

Vthe: Threshold voltage of an erased SONOS FET.

Vpm: A programmed SONOS FET's ( or FETs' ) margin voltage, which correlates to an enhancement FET's threshold voltage. It is the gate voltage (Vg) that triggers a small reference current in a bit line while the FET's source is held at fixed bias VR.

Vthp: Threshold voltage of a programmed SONOS FET

FIGURE 10

METHOD AND SYSTEM FOR PROGRAMMING A MEMORY DEVICE

This Application is a Continuation of U.S. patent application Ser. No. 10/172,670 now U.S. Pat. No. 6,661,724, Entitled "METHOD AND SYSTEM FOR PROGRAMMING A MEMORY DEVICE" to Snyder et al. filed Jun. 13, 2002.

FIELD OF THE INVENTION

The present invention relates to the field of memory devices. Specifically, embodiments of the present invention relate to methods and systems for programming a memory device.

BACKGROUND ART

Presently, electronic memories come in a variety of forms and serve a variety of purposes. For example, one type of memory is flash memory. Generally, flash memories are used for non-volatile, fast information storage in devices such as digital cameras and home video consoles. Flash memory may be considered a solid state storage device.

In general, flash memory is a type of electrically erasable programmable read-only memory (EEPROM). It has a grid of columns and rows with a cell that has one of two transistors at each intersection. One of the transistors has a floating gate. When the floating gate has a neutral or positive net charge stored it conducts and the cell has a value of one. To change the value to a zero a process called Fowler-Nordheim (FN) tunneling is utilized.

FN tunneling is used to alter the placement of electrons in the floating gate. For example, a voltage is applied to the control gate above the floating gate and drain to the ground. This electric field causes the floating-gate transistor to act similar to an electron gun. That is, the electrons are pushed through and trapped on the other side of the TOX layer, giving it a negative charge. These negatively charged electrons act as a barrier between the control gate and the floating gate. A cell sensor then monitors the level of the charge passing through the floating gate. If the flow through the gate is greater than 50 percent of the charge, then it has a value of one. However, when the charge passing through the gate drops below the 50 percent threshold, the value changes to zero. Normally, a blank EEPROM has all of the gates fully open, giving each cell a value of one.

The electrons in the cells of a flash-memory can be returned to a normal state (e.g., one) by the application of an electric field (e.g., a higher voltage). Furthermore, flash memory utilizes in-circuit wiring to apply the electric field either to the entire chip or to predetermined sections known as blocks. This electrical field erases the target area of the chip, which can then be rewritten. Therefore, flash memory works much faster than traditional EEPROMs because instead of erasing one byte at a time, it erases a block or the entire chip. In addition, flash memory is non-volatile and as such it will maintain its data without an external source of power. Thus, it is extremely useful with removable memory media such as digital cameras, digital music players, video consoles, computers, and the like.

Generally speaking, EEPROMs generate high voltages to induce electrons to move on and off of a floating gate in a metal oxide semiconductor field effect transistor (MOSFET) which charges the transistors threshold voltage. By changing the voltage that effects the threshold of the device one can effect the current that will flow through it when it is powered. Logic one or zero can be determined by sensing the amount of current that can flow through the transistor at a given control gate voltage.

The electrons are free to move with no actual physical connection to the gate. So what is needed is an induction of the electrons to get them to move on or off of the poly-silicon electrode. This is done by applying high voltage to nodes that are near the floating gate. For example, a high voltage may be applied to the drain, source, or in some cases an extra gate electrode located nearby. Electrons move either because they are ballistic (e.g., high energy) or they tunnel due to quantum effect. In both cases, they move on and off the floating electrode. In flash technology, quantum tunneling is used. However, the electrons may be moved by ultraviolet light (UV) or X-ray.

The key is to get the right number of electrons on or off the electrode. However, since there is no way to touch the electrode, there is no way to measure the exact number of electrons thereon. Thus, the number of electrons thereon must be inferred based on the variations of the current flow through the transistor of a programmed device. If too many electrons are on or off the device, early failure of the device may occur. In addition, there may be degradation in the current flow. Thus, to maximize reliability, better control of the number of electrons actually placed on the device is needed.

Currently, the voltages are generated by a voltage pump that applies an electric field for a certain period of time during the memory programming process. Thus, by controlling both voltage and time, a basic statistical inference can be made with regard to the amount of electrons that will be moved. Then, the device can be tested for the correct current flow parameters. For example, a statistical process may be used to define a number of volts and a time period for applying the voltage that will result in correct programming.

Thus, for a specific manufacturing process, a publication by the manufacturer may state a voltage of 10 volts needs to be applied for 10 milliseconds to ensure proper operation or device programming. However, there are many statistical variations within such a method, and therefore deleterious effects may result within the device depending on the environment in which programming occurs. Moreover, in order to resolve the reliability of the published voltages and times, a further trial and error process is typically done to ensure that the correct current is indeed passing through the device. Such excessive testing may be both monetarily inhibiting and time consuming.

SUMMARY OF INVENTION

Thus, a need exists for an improved method for programming a flash or other non-volatile memory device. A further need exists for a method for programming a flash memory device, which can apply the most efficient programming voltage and programming time for a specific memory device. A further need exists for a method for programming a memory device which can proficiently utilize the memory device temperature when calculating the most efficient programming voltage and programming time for a specific memory device. Still another need exists for a method for programming a memory device which is compatible with existing memory device programming processes.

A method for programming a memory device is disclosed. In one method embodiment, the present invention receives a measurement from a temperature sensor located near a memory to be programmed. Next, a pre-existing transformation is electronically accessed. Then, the measurement from the temperature sensor is processed in conjunction with the transformation which provides a programming time for a memory device as a function of a programming voltage and the temperature. The programming voltage is then applied to the memory device for the length of time specified by the programming time in order to properly program the memory device. In one embodiment, the memory device is flash memory.

In one exemplary system, a host computer system downloads data to a programmable device to be programmed. The programmable device contains a programmable memory array, a voltage pump, a pulse width generator, a temperature sensor, a controller, and a transformation as described above. The controller accesses the transformation based on the current temperature reading from the sensor. Programming voltage and pulse width data supplied from the transformation are provided to the charge pump and pulse width generator. Memory programming then commences using techniques known in the art.

In one embodiment, the present invention is implemented in a microcontroller included on a single substrate. The microcontroller includes a microprocessor, a plurality of internal peripherals, an interconnecting component, an external coupling port, and a memory for storing instructions. The microprocessor processes information. The plurality of internal peripherals are programmably configurable to perform a variety of functions associated with the microcontroller. The interconnecting component is programmably configurable for selectively interconnecting the plurality of internal peripherals and other internal microcontroller components. The external coupling port is programmably configurable to implement different connectability states by which the electronic system is connectable to an external device. The memory stores instructions and data (e.g., a configuration image) directed at setting the configurations and functions allocated to the plurality of internal peripherals, the interconnecting component and the external coupling port.

In one embodiment of the present invention, the configuration and functionality of an electronic device is defined by a configuration image programmed in a memory of the electronic device. The configuration image includes instructions and data for implementing the configuration and functions. In one embodiment, a plurality of configuration images facilitate dynamic reconfiguration of a programmable system on a chip (PSOC). In one exemplary implementation of the present invention, a configuration image includes user module personalization data (e.g., PSOC configuration table), module parameterization data, application program interface (API) data, and user program code. Based upon the existence of a predetermined condition, the PSOC is automatically reconfigured by activating different configuration images. In one embodiment, activating different configuration images results in different values being loaded in configuration registers of functional circuit blocks included in the PSOC.

The present invention provides, in various embodiments, methods for programming a memory device. Embodiments of the present invention also provide a method for programming a memory device, which can calculate the most efficient programming voltage and programming time for a specific memory device. The present invention further provides a method for programming a memory device, which can proficiently utilize the memory device temperature when calculating the most efficient programming voltage and programming time for a specific memory device. The present invention also provides a method for programming a memory device, which is compatible with existing memory device programming processes.

BRIEF DESCRIPTION OF THE DRAWINGS

The accompanying drawings, which are incorporated in and form a part of this specification, illustrate embodiments of the invention and, together with the description, serve to explain the principles of the invention.

FIGS. 5A, 5B, 5C, 5D, 5E, and 5F are exemplary graphs used to vary both the erase and program pulse widths as a function of temperature in accordance with an embodiment of the present invention.

FIG. 9 is a flow chart of a PSOC design tool process illustrating exemplary steps used by a design tool in accordance with one embodiment of the present invention.

FIG. 10 is a table of exemplary variable definitions in accordance with one embodiment of the present invention.

DETAILED DESCRIPTION OF THE INVENTION

Figure 1:
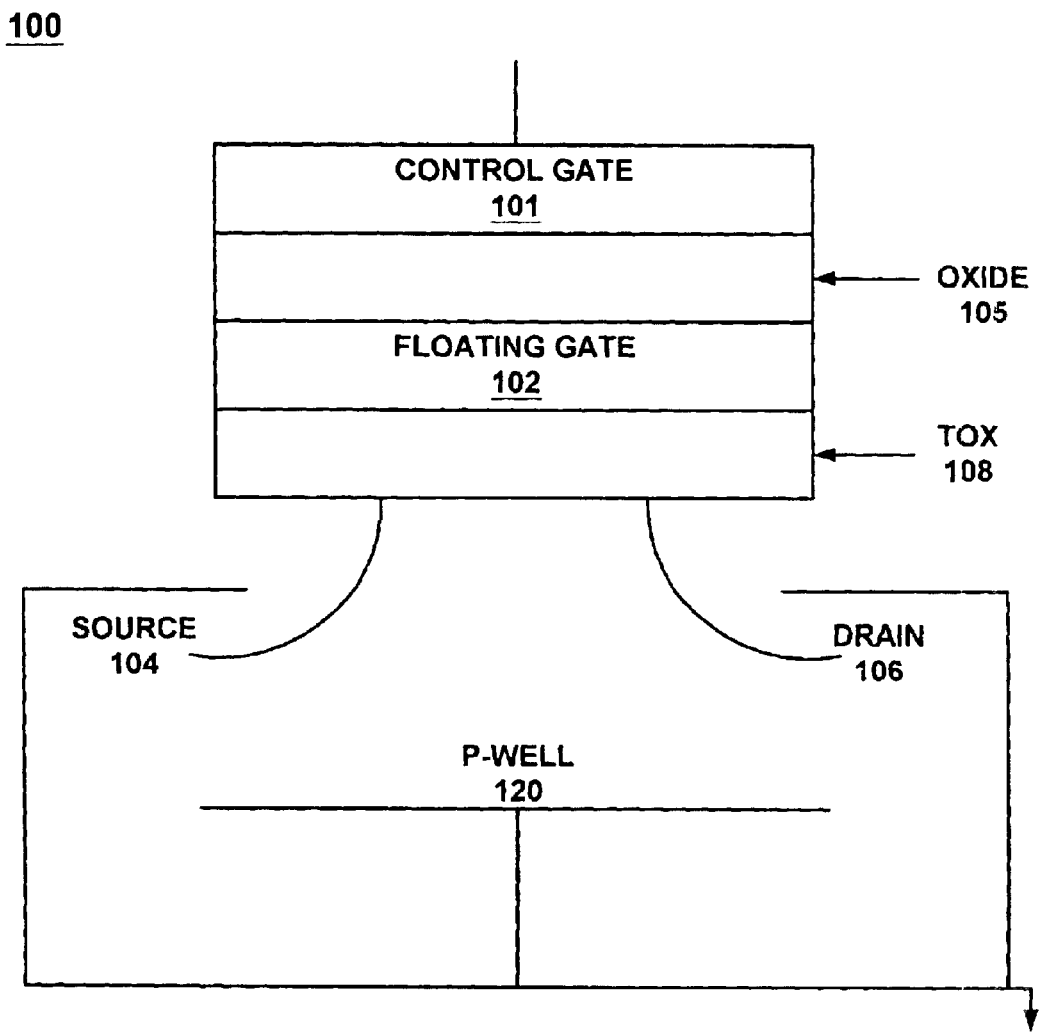
FIG. 1 is a block diagram of an exemplary memory device in accordance with an embodiment of the present invention for programming a memory device.

Reference will now be made in detail to embodiments of the invention, examples of which are illustrated in the accompanying drawings. While the invention will be described in conjunction with the preferred embodiments, it will be understood that they are not intended to limit the invention to these embodiments. On the contrary, the invention is intended to cover alternatives, modifications and equivalents, which may be included within the spirit and scope of the invention as defined by the appended claims. Furthermore, in the following detailed description of the present invention, numerous specific details are set forth in order to provide a thorough understanding of the present invention. However, the present invention may be practiced without these specific details. In other instances, well-known methods, procedures, components, and circuits have not been described in detail as not to unnecessarily obscure aspects of the present invention.

Some portions of the detailed descriptions which follow are presented in terms of procedures, logic blocks, processing, and other symbolic representations of operations on data bits within an electronic computing device and/or memory system. These descriptions and representations are the means used by those skilled in the data processing arts to most effectively convey the substance of their work to others skilled in the art. A procedure, logic block, process, etc., is herein, and generally, conceived to be a self-consistent sequence of steps or instructions leading to a result. The steps are those requiring physical manipulations of physical quantities. Usually, though not necessarily, these physical manipulations take the form of electrical, magnetic, optical or audio signals capable of being stored, transferred, combined, compared, and otherwise manipulated in a computer system or similar electronic computing device. For reasons of convenience, and with reference to common usage, these signals are referred to as bits, values, elements, symbols, characters, terms, numbers, or the like with reference to the present invention.

It should be borne in mind, however, that all of these terms are to be interpreted as referencing physical manipulations and quantities and are merely convenient labels and are to be interpreted further in view of terms commonly used in the art. Unless specifically stated otherwise as apparent from the following discussions, it is understood that throughout discussions of the present invention, discussions utilizing terms such as "transmitting", "receiving", "offsetting", "creating", "storing", "delivering", "accessing", "generating", "providing", "processing", "outputting", "returning", "applying" or the like, refer to the action and processes of a computer system, or similar electronic computing device, that manipulates and transforms data. The data is represented as physical (electronic) quantities within the computing device's registers and memories and is transformed into other data similarly represented as physical quantities within the computing device's memories or registers or other such information storage, transmission, or display devices.

With reference now to FIG. 1, in one embodiment, during the programming of a memory device such as memory device 100, the effects of temperature are utilized in conjunction with voltage and time to more optimally program the device. Specifically, during the programming of memory device 100, tunnel effects such as Fowler-Nordheim (FN) tunneling may be temperature sensitive. Therefore, the amount of time that a programming voltage is applied is not a constant amount but in fact temperature dependent. Thus, to program memory device 100, three variables are taken into account. The three variables are time, voltage, and temperature. Programming with accurate charge is desirable because under programming leads to data corruption and over-programming may consume too much time as well as lead to data corruption.

The memory device described herein may be any type of non-volatile memory. In one embodiment, memory device 100 may be a flash memory device. Furthermore, memory device 100 may comprise control gate 101, floating gate 102, source 104, drain 106, oxide 105, tunnel oxide (TOX) 108, and P-well 120. In addition, memory device 100 may be a portion of a programmable electronic device, e.g., a microcontroller programmable system on a chip (PSOC). A more detailed description of a microcontroller PSOC will be covered in more detail herein.

Figure 2:
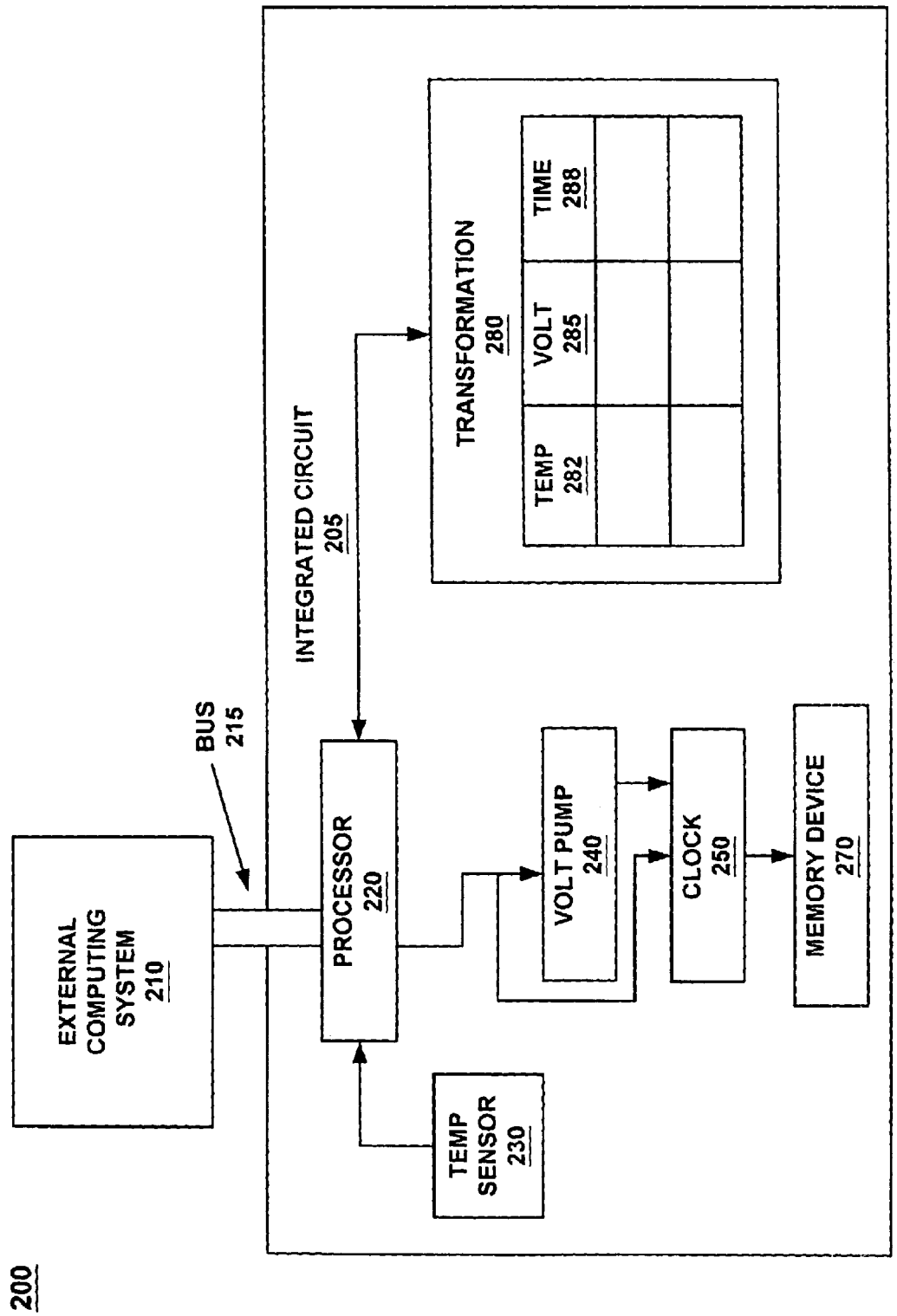
FIG. 2 is a block diagram of an exemplary system for programming a memory device in accordance with an embodiment of the present invention.

With reference now to FIG. 2, a block diagram of an exemplary system 200 for programming a memory device is shown in accordance with one embodiment of the present invention. In one embodiment, FIG. 2 is comprised of integrated circuit 205, external computing system 210, bus 215, processor 220 of integrated circuit 205, temperature sensor 230 of integrated circuit 205, voltage pump 240 of integrated circuit 205, clock (pulse width generator) 250 of integrated circuit 205, memory device 270 of integrated circuit 205, and transformation 280 of integrated circuit 205.

In one embodiment, external computing system 210 may be a host system, e.g., a PC (personal computer), a mobile computing system, or the like, that may send data to be transferred into memory device 270. Bus 215, processor 220, and memory device 270 may be a multiplicity of computing devices and structures such as those discussed in more detail herein. For example, memory device 270 may be a flash memory device. Furthermore, in one embodiment, processor 220 may be a microprocessor. In addition, integrated circuit 205 may be a microcontroller PSOC. The temperature sensor 230 may be on-chip or it may be external to integrated circuit 205.

Temperature sensor 230 may record or supply the current temperature of memory device 270, and/or integrated circuit 205, and/or ambient air temperature around memory device 270 and/or integrated circuit 205. For example, temperature sensor 230 may be utilized for measuring the temperature proximal to memory device 270. Temperature sensor 230 may also be a fixed constant temperature value at which the system is known to operate. Voltage pump 240 may be a device that can generate a specified voltage based on a programmable input value. In one embodiment, voltage pump 240 may be able to generate only a fixed voltage. In another embodiment, voltage pump 240 may be able to generate a variable range of voltages based on a programmable input voltage value. Pulse width generator 250 may be any type of clock (analogue or digital) that may be utilized to generate a pulse width, or a certain number of pulse widths. For example, clock 250 may be a programmable pulse width generator.

In one embodiment, transformation 280 is a memory table which has a time column 288, a voltage column 285, and a temperature column 282 containing variables. Moreover, transformation 280 is programmed with information pertinent to a particular memory device 270 at manufacture. For example, when a memory device 270 is manufactured, a test may be run on the device to determine its optimal characteristics (e.g., programming time as a function of temperature and voltage, programming voltage as a function of temperature and time, or programming temperature as a function of voltage and time). These optimal characteristics are then stored as data in the transformation 280. It is appreciated that the data stored in transformation 280 may be a simple look-up table, such as that described above, or may contain constants of factors for equations used to calculate parameters (as described in FIG. 3). Thus, when memory device 270 needs to be programmed, the optimal voltage and duration of voltage application based on a given temperature may be referenced from transformation 280. Transformation 280 may be stored on non-volatile memory such as ROM or a preprogrammed flash, or any other memory device such as those described herein. Additional description of the initial testing of the device is described in more detail herein.

Referring still to FIG. 2, in one embodiment, external computing system 210 sends a request via bus 215 for processor 220 to place data into memory device 270. Upon reception of the request, processor 220 begins the programming process for memory device 270. Initially, processor 220 accesses temperature sensor 230 of integrated circuit 205. Temperature sensor 230 then supplies a measurement of the temperature of memory device 270 to processor 220. In another embodiment, temperature sensor 230 may constantly supply the temperature measurement to processor 220. In addition, although temperature sensor 230 is stated as measuring the temperature of memory device 270, temperature sensor 230 may measure any of the components of or around integrated circuit 205.

Upon reception of the temperature measurement from temperature sensor 230, processor 220 accesses transformation 280. Processor 220 then uses the temperature provided by temperature sensor 230 as an index to transformation 280 which provides a programming time for memory device 270 as a function of programming voltage and temperature. If voltage is a fixed amount, then the transformation 280 supplies only a programming time. Otherwise, the transformation 280 may provide a programming time based on an input temperature and voltage. If only temperature is provided and voltage is not fixed, then the transformation 280 will provide an optimal voltage and programming time for that voltage.

Referring still to FIG. 2, processor 220 then accesses voltage pump 240. As stated herein, voltage pump 240 is utilized to apply the programming voltage to memory device 270. In one embodiment, voltage pump 240 is controlled by processor 220. For example, voltage pump 240 may be a programmable voltage pump that can produce a range of voltages. Thus, processor 220 may program the voltage to be produced by voltage pump 240 based on a voltage data output from transformation 280. In another embodiment, voltage pump 240 may only produce one voltage.

After establishing the parameters of the voltage output of voltage pump 240, processor 220 may complete the programming process of memory device 270 by supplying the appropriate programming time (as provided from transformation 280) to clock 250, For example, with the temperature and voltage defined, processor 220 may utilize transformation 280 (e.g., programming time 288 as a function of both voltage 285 and temperature 282) to establish the optimal time for which memory device 270 should receive the voltage pulse. This programming time is then programmed into the pulse width modulator 250.

Referring still to FIG. 2, when the pulse width and voltage are programmed, the voltage is then applied to memory device 270 for the specified pulse width duration to program memory 270 with data simultaneously supplied in digital form from the host device 210 over bus 215. For example, processor 220 may program a specific pulse width into clock 250. Clock 250 then allows volt pump 240 to provide memory device 270 with the optimal voltage for the specified pulse length to program the data. Due to the pre-programmed transformations, memory device 280 is not over-programmed and therefore not over-stressed. In general, over-programming results in additional stress being placed on memory device 270 resulting in longer programming cycles, a shorter life span, inefficient programming, or the like. Further, the memory is not under-programmed. In general, under-programming results in corruption of the data being stored.

Figure 3:
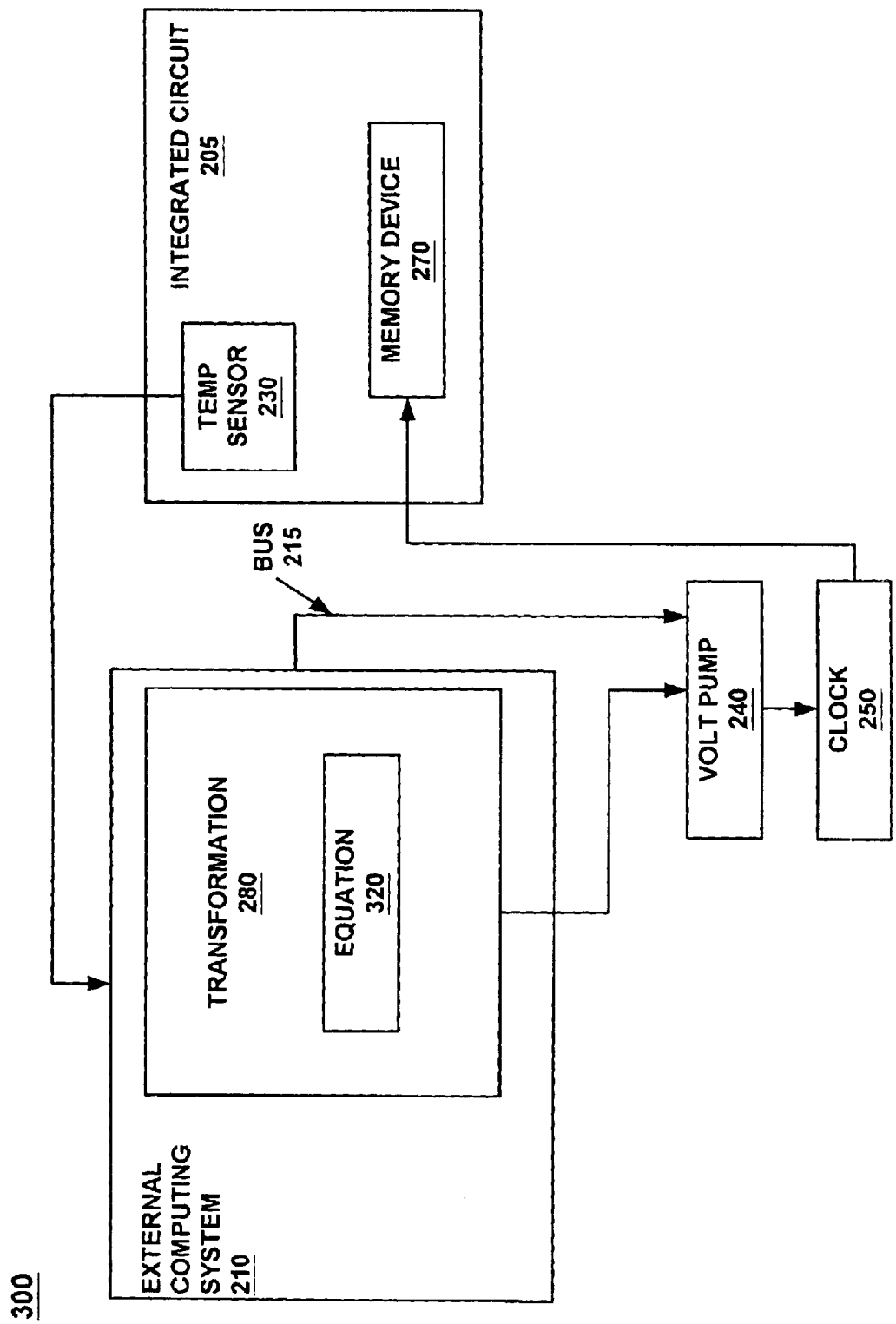
FIG. 3 is a block diagram of an exemplary system for programming a memory device in accordance with another embodiment of the present invention.

With reference now to FIG. 3, a block diagram of an exemplary system 300 for programming a memory device is shown in accordance with another embodiment of the present invention. In general, system 300 operates in a similar fashion to system 200. However, as shown in FIG. 3, the plurality of parts utilized by system 300 may not necessarily be within integrated circuit 205. For example, in system 300 only memory device 270 and temperature sensor 230 are integral within integrated circuit 205. In addition, transformation 280 of system 300 has an equation based format.

Furthermore, in system 300, transformation 280 (shown in one embodiment comprising equation 320, but may be a table as shown in system 200) may be located external to memory 270, e.g., coupled with external computing system 210.

Moreover, transformation 280 may be external as well, e.g., stored in a memory device such as read access memory (RAM), read only memory (ROM), flash memory, or the like, which may or may not be located on external computing system 210.

Referring still to FIG. 3, in one embodiment, the processor utilized for accessing transformation 280 may be integrated with external computing system 210. Thus, external computing system 210 may utilize the temperature provided by temperature sensor 230 in conjunction with transformation 280 to establish a programming time for memory device 270 as a function of a programming voltage and temperature equation (or set of equations). In another embodiment, external computing system 210 may utilize the temperature provided by temperature sensor 230 in conjunction with transformation 280 to establish a programming voltage for memory device 270 as a function of a programming time and temperature equation (or set of equations).

External computing system 210 may utilize bus 215 to program and control voltage pump 240, thereby providing the voltage for programming memory device 270. Furthermore, external computing system 210 may program pulse width modulator 250 for regulating the time that the voltage will be applied to memory device 270 during programming.

Although two configurations of the system for programming a memory device are shown, it is appreciated that the arrangement of each portion of both system 200 and system 300 may are exemplary. Furthermore, the present invention is well suited to a multitude of possible configurations.

Figure 4:
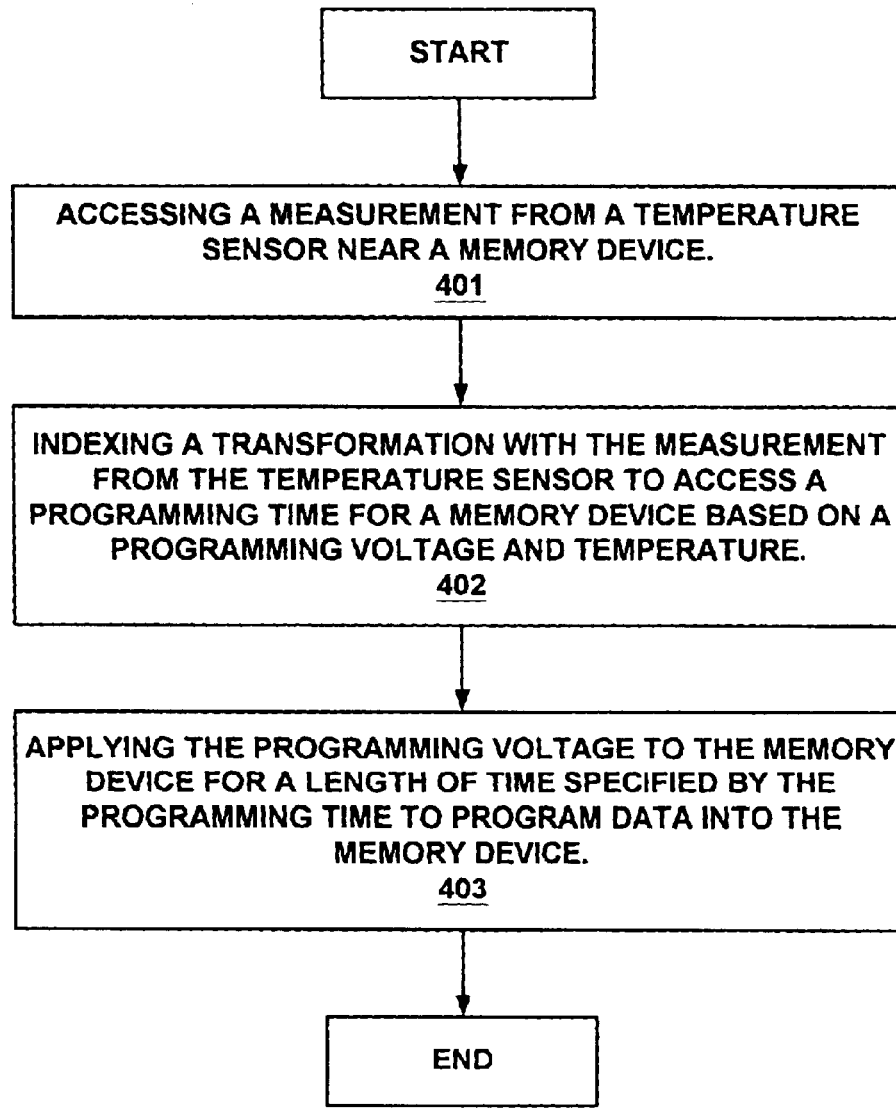
FIG. 4 is a flowchart of steps performed in accordance with one embodiment of the present invention for programming a memory device.

With reference now to FIG. 4, a flowchart of steps performed in accordance with one embodiment of the present invention is shown. In one embodiment, the processes described herein, for example, in flowchart 400, are comprised of computer readable and computer executable instructions which reside in data storage resources of a computer system. The computer system includes, for example, non-volatile and volatile memory, a bus, and a processor. Further, the computer-readable and computer-executable instructions are used to control, or operate in conjunction with, the processor.

Referring now to step 401 of FIG. 4, in one embodiment a measurement is accessed from a temperature sensor near a memory device. As stated herein, the measurement may be received by a processor such as the microprocessor portion of a PSOC, or an embedded processor coupled with a computing system. In addition, the measurement may be received due to a request for the measurement from an outside device, as part of a regularly scheduled data burst, or the like. Moreover, the temperature sensor may measure the temperature of a memory device, of a location proximal to the memory device, or of the ambient air around the memory device.

Referring still to step 401 of FIG. 4 and FIG. 2, in one embodiment a transformation is accessed. Transformation 280 is preprogrammed based on the specific memory device 270 with which it is coupled and contains data for a number of different programming environments. In one embodiment, transformation 280 has time 288, voltage 285, and temperature 282 variables. In another embodiment, transformation 280 may have only time 288 as a function of temperature 282 with a constant voltage 285 assumed. In yet another embodiment, transformation 280 may have only voltage 285 as a function of temperature 282 with a constant time 288. In another embodiment, transformation 280 may contain equations that can 'be utilized by processor 220 to calculate the programming voltage and time constraints.

With reference now to step 402 of FIG. 4 and FIG. 2, transformation 280 is indexed with the measurement from temperature sensor 230 to access a programming time for a memory device based on a programming voltage and temperature. In one embodiment, the processing is performed by processor 220 of integrated circuit 205. For example, processor 220 may establish a programming time 288 for memory device 270 as a function of a programming voltage 285 and temperature 282. In another embodiment, processor 220 may be a microprocessor PSOC. In yet another embodiment, processor 220 may be completely separate from integrated circuit 205. At step 403, the pulse width modulator is programmed and the voltage pump may be programmed.

Referring now to step 403 of FIG. 4 and FIG. 2, programming voltage 285 is applied to memory device 270 for the length of time specified by programming time 288 to program data into memory 270. For example, processor 220 utilizes voltage pump 240 to supply the programming voltage for memory device 270. Furthermore, processor 220 utilizes clock 250 to ensure the correct programming time for applying the programming voltage occurs. In one embodiment, clock 250 is a pulse width clock of integrated circuit 205.

With reference now to FIGS. 5A–5F, a description of the process used to vary both the erase and program pulse widths as a function of temperature is shown in accordance with an embodiment of the present invention. Initially, an entire array or a single block along a word line is first put into the erased state. From this state the other states of data 0 or data 1 may be obtained. One field-effect transistor (FET) may remain erased and the other may remain programmed. It is the single erased FET that is sensed. The erase state may utilize a pulse duration between 1 and 20 ms depending on the high voltage pump output (Vpp), temperature and process corner. The write states utilize similar pulse durations.

Repeated erase operations at any given pulse width, on an erased FET causes that FET's threshold voltage to first decrease, but over many erase operations to eventually increase. This lowers the current available for read sensing and after some large number of cycles (10K to 100K) there is insufficient current and the device fails to function during read. Repeated program operations raise an enhancement device's threshold, which fortunately is a beneficial effect.

As temperature increases the walkup of the erase threshold accelerates. Fortunately the duration of pulse to achieve a proper erased state decreases as temperature increases. These two effects aid each other. In fact, first order cancellation of threshold walkup can be achieved by controlling pulse width.

As temperature decreases the walkup of erase or program thresholds decrease, however, the effectiveness of an erase or programming action decreases, requiring longer pulse widths.

In one example, the erased device is designed and characterized around a Vs=1.8 V @ 25C. The main result is that device currents are lower that models predict, Vds is smaller so the bit line speeds are lower.

In general, a related gate voltage is used when an erased device in a flash memory has Ids exceeding a small reference current (e.g., just turns on). This, voltage is called the erase margin voltage, and is sensed in the flash memory during special test modes. It is possible to measure the margin voltages of any erased FET in the entire array (as well as the margin voltage of any Programmed FET also).

The PSOC devices have some features that allow for good control over the flash memory's programming. In one embodiment, these include independent 0.25 ms resolution and ranges from 1.0 ms to 20 ms over both the erase and program pulse widths. Secondarily, the Vbg (band-gap reference that regulates the Vpp pump voltage) is trim-able over a +/−10% range, while maintaining a 2% accuracy. In addition, characterization data for dynamic control of the programming process can be stored into easily accessible tables that are available to $E^2$ emulation APIs (Application Programming Interfaces).

With reference now to FIG. 5A, in one embodiment flash table 500 is used for one exemplary temperature adaptive programming process. However, the erase curves (e.g., graph 550 of FIG. 5C) need to represent values in the units that the built in flash hardware understands. Therefore, the time units may not be milli-seconds (ms), but instead clockrates. For example, a clockrate of 90 represents 10.006 ms.

Figure 5B:
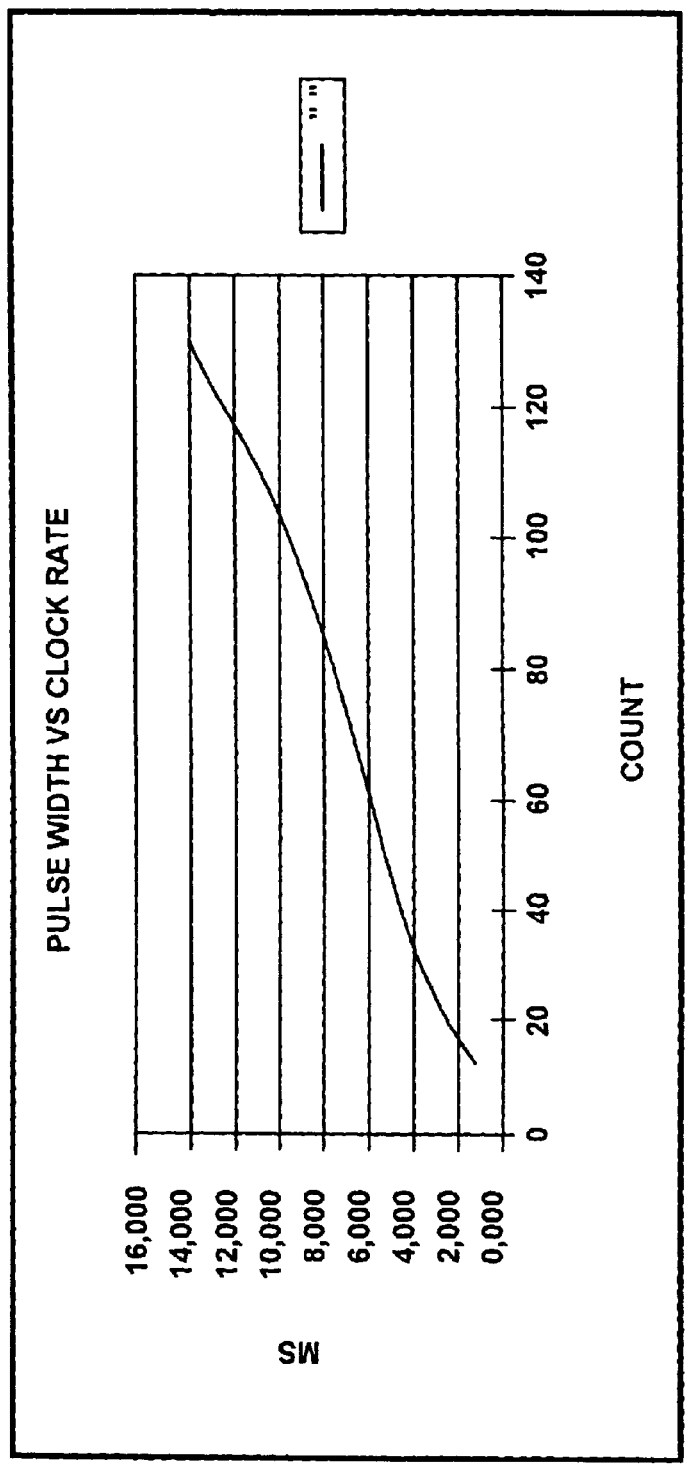

Referring now to graph 525 of FIG. 5B, a pulse width vs. clockrate graph shows one exemplary relationship between actual pulse width and the clockrate count parameter passed to the flash system calls. The following equations perform scaling utilizing the following variables. (T) is temperature in units of degree 'Celsius/128'; (M) is erase slope from FIG. 5A applicable to <0 or >=0 temperature range (unsigned char); and (B) is erase intercept from FIG. 5A applicable to <0 or >=0 temperature range (unsigned char). Thus, the equation to perform the scaling is:

$$PW_{(ClockrateRate\ units)} = B - (M \times T) \times 2/256$$

In one embodiment, the 'x2/256' and temperature units allow 8-bit math to work efficiently and with maximal resolution. The 'x2' is a 1 bit shift, and the '/256' is a memory index, this saves having to divide by 128 which is much slower.

Figure 5C:
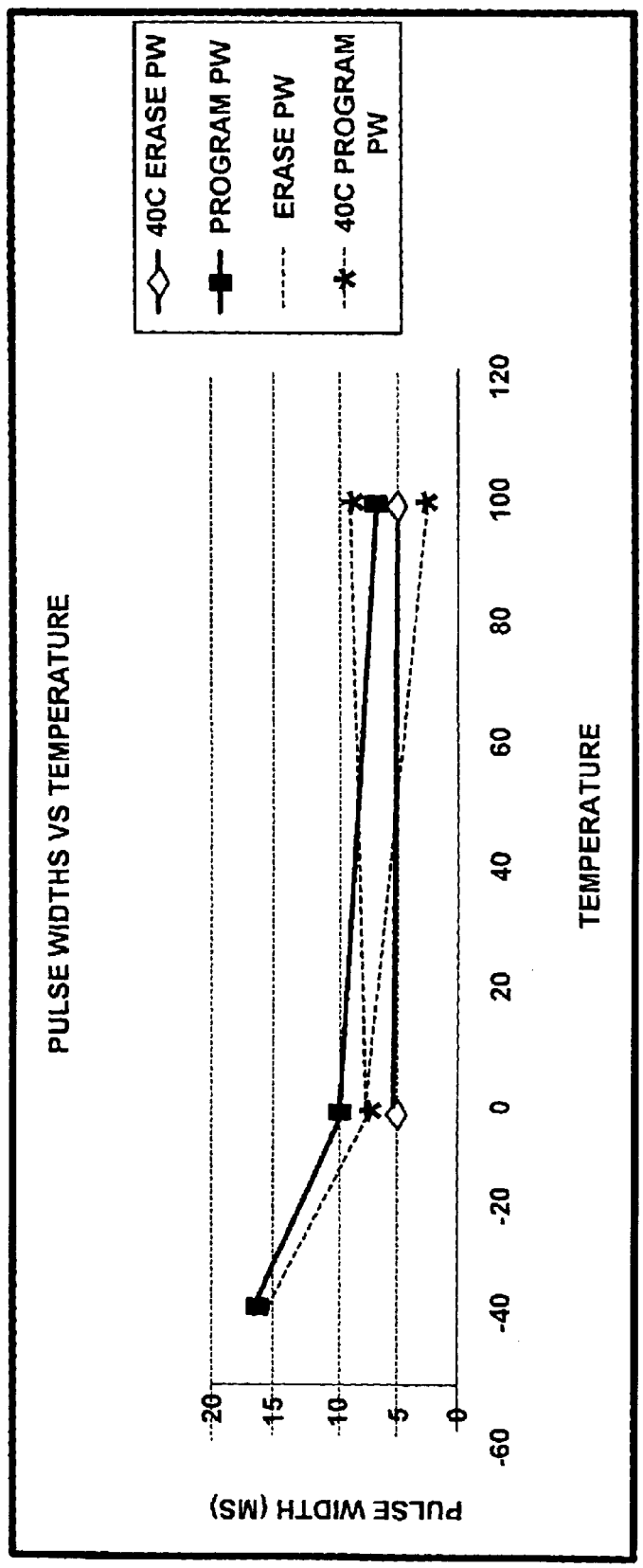

With reference now to FIG. 5C, the slope of the curves in graph 550 are always negative, but for ease of reading and dynamic range the M values are stored as positive numbers and their product with temperature is subtracted from the intercept. In addition, the program multiplier in FIG. 5C represents a [0.5 to 2.0] multiplier encoded in a single unsigned byte in the range [32,127] that is later divided by 64 to get the scaling. This operation is performed as follows:

$$PW_{(program)} = PW_{(erase)} * ProgramMultiplier/64.$$

Referring still to FIG. 5C, two linear curves are used in graph 550 to represent two possible temperature ranges. An industrial temperature range (e.g., −40 to 100) will be covered by two lines, connected at zero degrees Celsius (C), while a commercial temperature range (e.g., 0 to 100) will be shown as a single line. In one exemplary embodiment, the process desires the user to know the junction temperature of the device being programmed (e.g., memory device 270). Furthermore, in one embodiment, only the curves for erasing memory device 270 will be stored, and the programming pulse will be derived by scaling the erase curves by a simple multiplier for each temperature range. In another embodiment, the programming pulse widths are stored and are usually greater or equal to the erase pulse widths at any given temperature.

With reference now to FIG. 10, Table 10 is a description of the variable terms utilized herein.

Figure 5D:
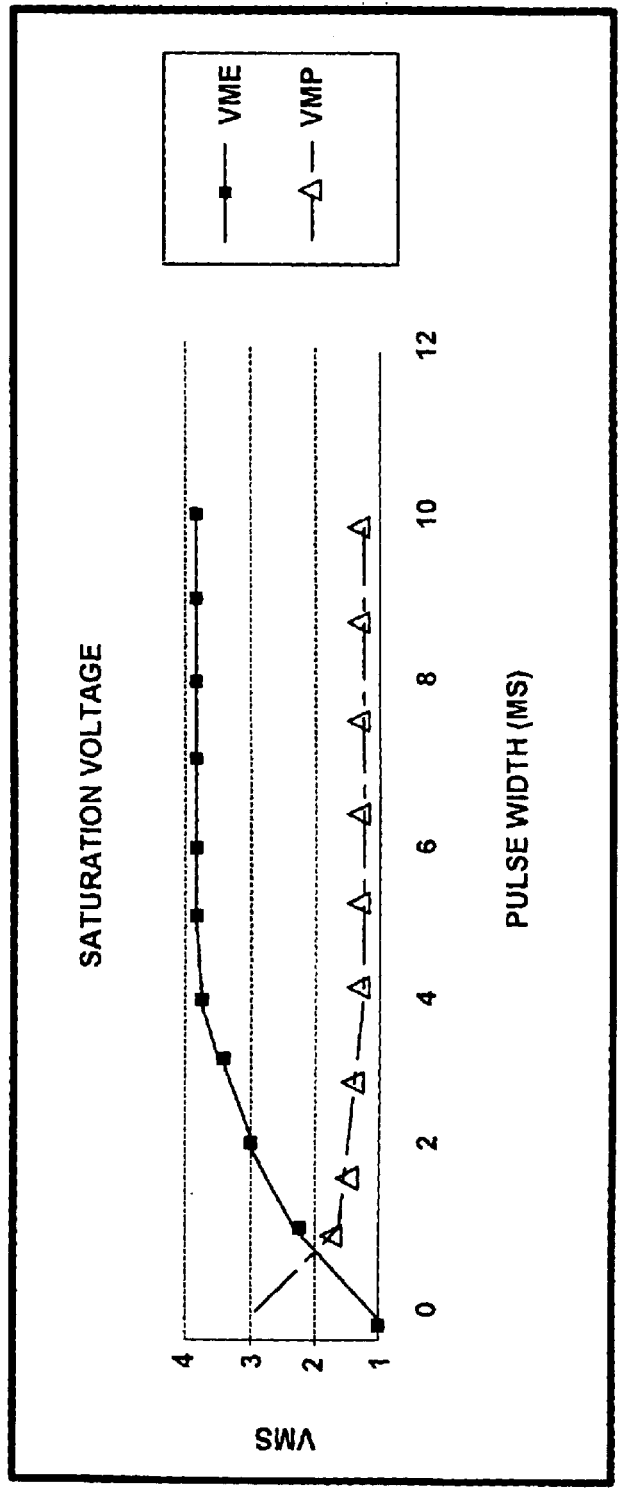

Referring now to FIG. 5D, graph 570 shows saturation voltage versus pulse width for an exemplary case. In one embodiment, the ideal pulse width can be determined based on the erase margin saturation curve for each die. That is, Vem and Vpm margin voltages reach saturation levels after a small integral pulse width, and greater pulse widths are increasingly less effective. Therefore, a minimum pulse width is utilized to reduce cycling stress while at the same time providing adequate charge storage so that data is retained.

In one embodiment, by starting from a known programmed state (6 cycles of erase, data 1, erase, data 0): Vem decreases rapidly then saturates to some low value (near 1.00V). This saturation value increases due to endurance cycling. By determining a pulse width for erasing that just brings a cell near saturation without excessive erasing, the number of cycles available for endurance may be maximized while still achieving full retention specs. In addition, by tracking the erase saturation curve for each die the effects of process variation and Vpp pump variations are fully compensated for. Therefore, there is no need to measure or track Vpp voltages during programming.

In one embodiment, by measuring each die's erase saturation curve at 25C and 100 C an ideal erase pulse width may be determined, and recording the linear curve equation data, into flash ROM tables that are accessible to user firmware for $E^2$ emulation. By utilizing empirical experimental/characterization, the values for the program pulse widths can be extrapolated from the measured erase pulse widths. The 25 C data may be determined during factory manufacturing testing, while the 100 C data may be determined via characterization.

The erase saturation data may be taken at −40C, 0C, 24C, and 85C forced ambient temperature. One embodiment of an exemplary testing model is shown below.
1) Cycle a block 6 times (at 10 ms pulse widths) performing Erase, Data 1, Erase, Data 0 states to establish an equilibrium condition for the erase margin states.
2) Write an Erase State into a block using the next pulse width from a series of 10.
3) Measure the Erase Margin voltage.
4) Repeat 1 through 3 for the next pulse width in the series.
1) Cycle a block 6 times performing Erase, Data 0, Erase, Data 1 states to establish an equilibrium condition for the Program Margin states.
2) Write an Erase State into all cells within the same block as 1) using a large pulse width (10 ms)
3) Program Data 0 into the block using the next pulse width from a series of 10.
4) Measure the Program Margin voltage.
5) Repeat 1 through 4 for the next pulse width in the series.

Figure 5E:
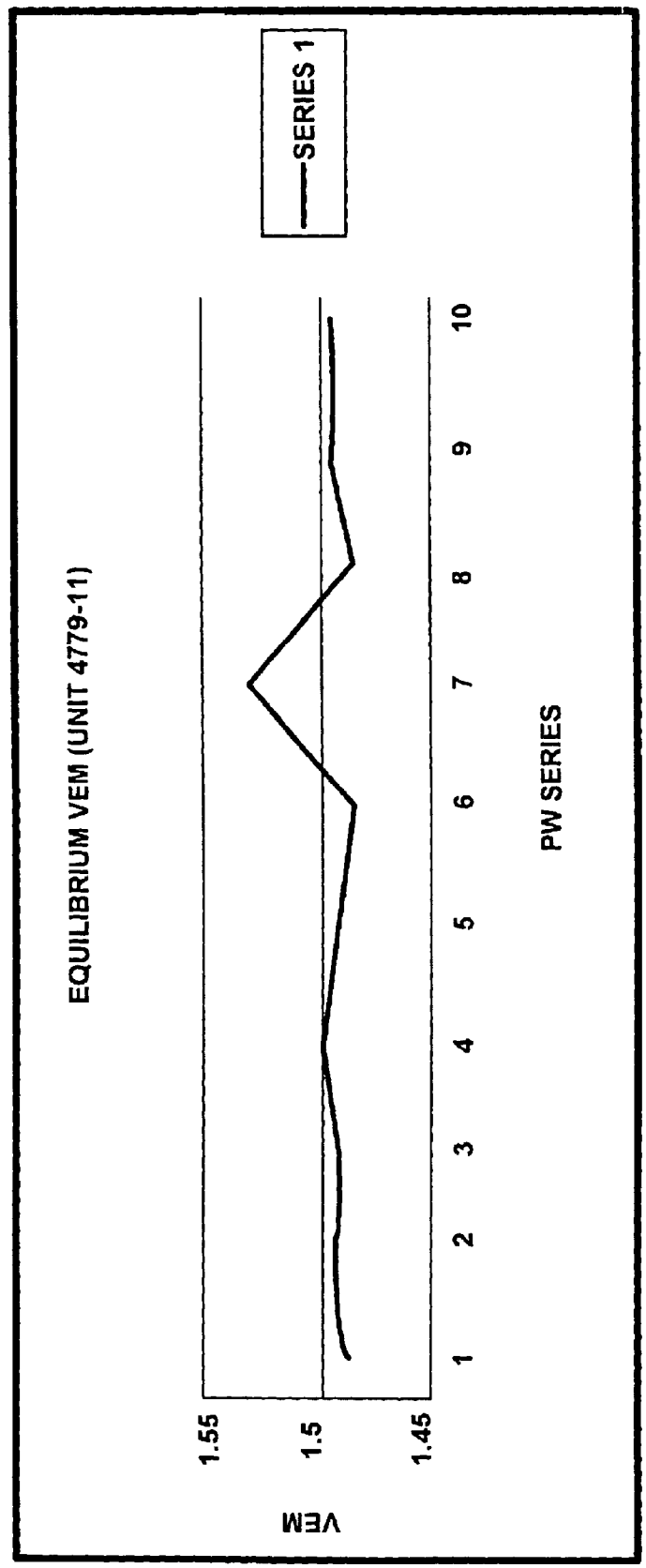

With reference now to FIG. 5E, the beginning Vem and Vpm thresholds during each series will be consistently close to each other and the Vem will decrease as the pulse width increases. Graph 580 shows that the erase margin after the initial 6 cycles, recovers to the same level more or less after each iteration, independent of pulse width of the erase that follows. The previously programmed FET experiences a weakened erase action that is not as deep as the FET that goes from erase with a program inhibit to being fully erased. This effect is generally detrimental.

Figure 5F:
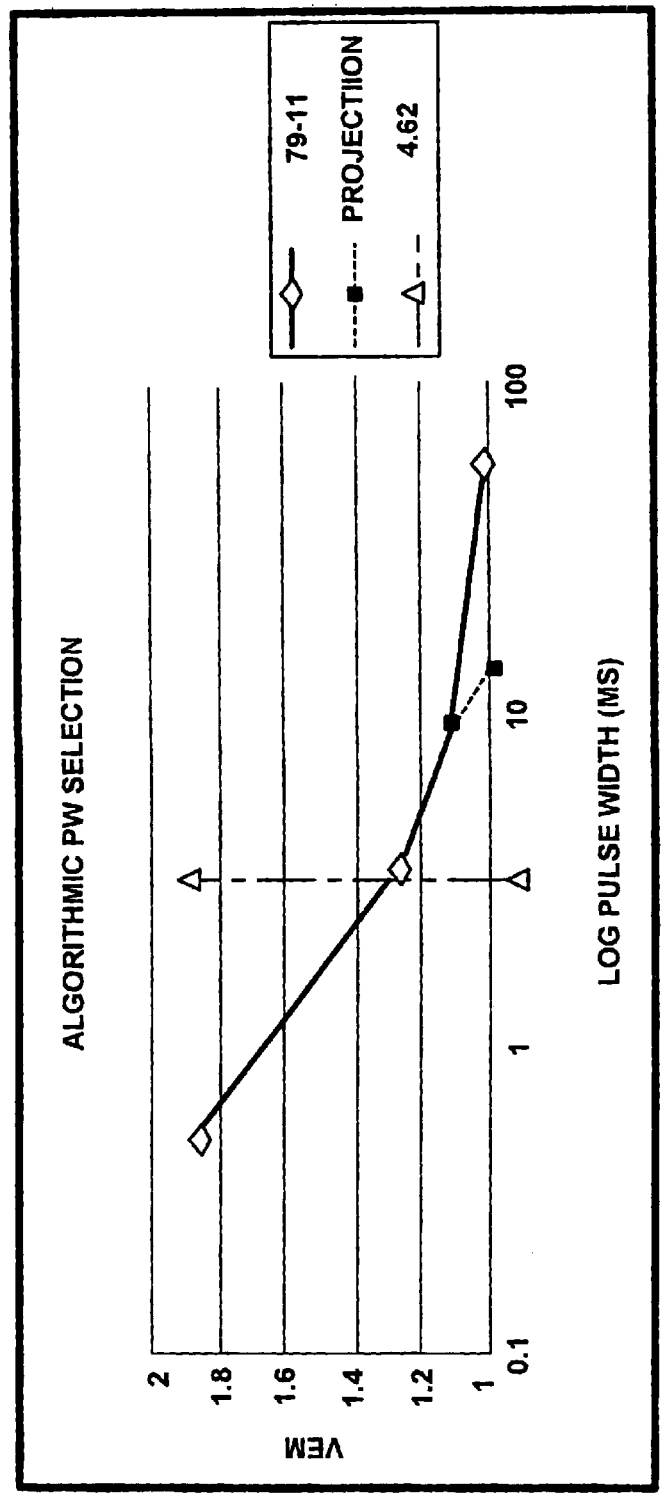
Figure 6:
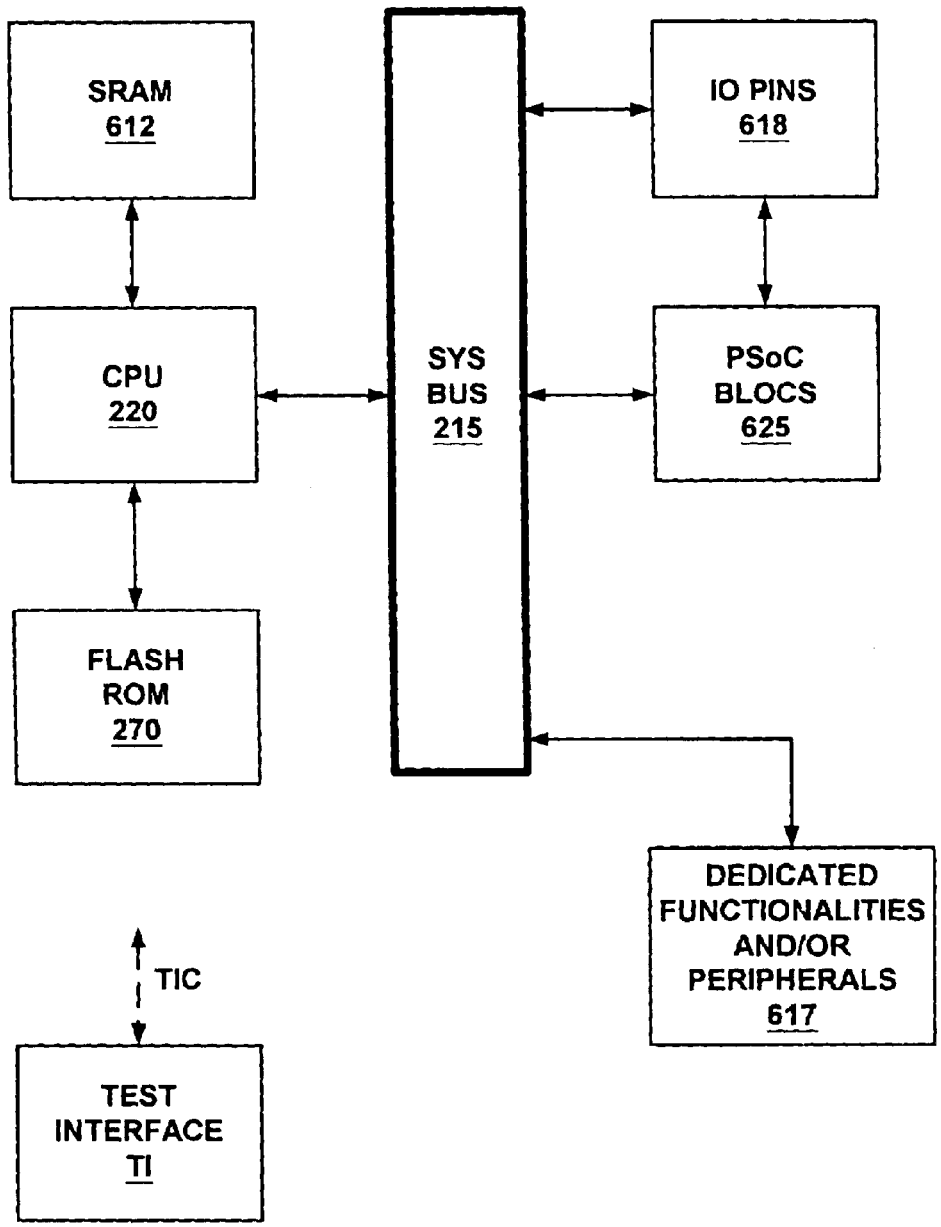
FIG. 6 is a block diagram showing a high level view of an exemplary integrated circuit (e.g., a microcontroller) upon which embodiments of the present invention may be implemented.

Referring now to FIG. 5F, as temperature changes from cold to hot, the ease of Vem saturation increases. Therefore, one process for determining erase pulse width includes taking the weighted average of $Vem_{(1)}$ after equilibrium cycling of E D0, E D1 states and the saturated erase margin $Vem_{(2)}$: $(Vem_{(1)}+9 * Vem_{(2)})/10=Vem_{(x)}$, and locating the pulse width on a die's Erase Saturation curve (per temperature) that would give this voltage $Vem_{(x)}$. This results in the pulse width for the temperature so chosen.

Moreover, since the saturation effects follow a log time vs. voltage curve, another embodiment for predicting pulse width includes cycling the die to stress nitride (equilibrated), applying the shortest possible erase pulse and measure $Vem_{(O)}$, applying 5.0 ms erase pulse and measure $Vem_{(5)}$, applying 50 ms erase pulse to saturate devices, measuring $Vem_{(S)}$, projecting a straight line from $Vem_{(O)}$ through $Vem_{(5)}$ to where it intersects the horizontal line at $Vem_{(S)}$, and taking 33% of the X intercept (time axis) as the optimal pulse width.

With reference now to FIGS. 6–9, a detailed description of PSOC operation is provided. The PSOC block contains programmable memory which can be programmed according to the embodiments of the present invention described herein. Specifically, with reference now to FIG. 6, a block diagram showing a high level view of an exemplary integrated circuit (e.g., a microcontroller) 610 upon which an embodiment of the present invention may be implemented. In one embodiment, integrated circuit 610 includes a communication bus 215, static random access memory (SRAM) 612, central processing unit (CPU) 220, flash read-only memory (ROM) 270, input/output (I/O) pin(s) 618 and PSOC functional component 625. Communication bus 215 is electrically coupled to static random access memory (SRAM) 612, central processing unit (CPU) 220, flash read-only memory (ROM) 270, input/output (I/O) pin(s) 618 and PSOC functional component 625. Static random access memory (SRAM) 612 stores volatile or temporary data during firmware execution. Central processing unit (CPU) 220 processes information and instructions. Flash read-only memory (ROM) 270 stores information and instructions (e.g., firmware). In one embodiment of the present invention, flash read-only memory (ROM) 270 stores configuration image data. Input/output (I/O) pin(s) 618 provides an interface with external devices (not shown). PSOC functional component 625 is programmable to provide different functions and configurations.

It is appreciated that integrated circuit 610 is readily adaptable to include a variety of other components. In one exemplary implementation, integrated circuit 610 also includes a dedicated functionality internal peripheral component 617 which is coupled to system bus 215 in addition to the PSOC functional component 625. In one embodiment, dedicated functionality internal peripheral component 617 includes temperature sensor 230. An optional test interface (TI) may be coupled to integrated circuit 610 via a test interface coupler (TIC), which may be detachable, to perform debugging operations during startup and initialization of the integrated circuit. In one embodiment of the present invention, additional functions such as clocking and power control are provided by a variety of components including a precision oscillator and phase locked loop (PLL), a voltage reference, a 32 kHz crystal oscillator (which may be utilized for a variety of applications such as calibration and synchronization, etc.), an interrupt controller (for generating interrupt signals as needed), a power on reset control unit (for performing functions related to power supply stability), and a brown-out detection unit (which detects substandard, subnominal power system parameters).

Figure 7A:
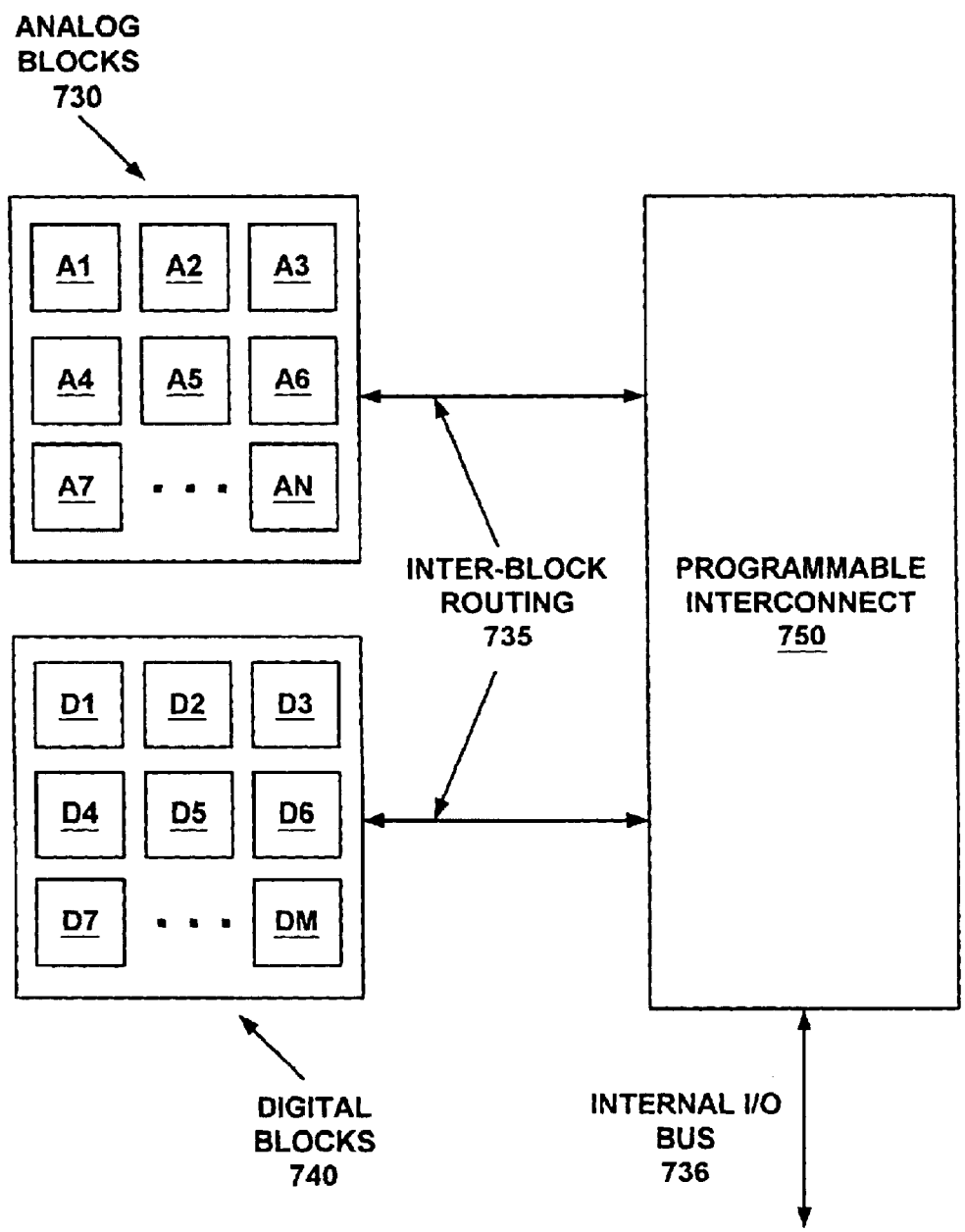
FIG. 7A is a block diagram of one embodiment of a PSOC functional component depicted in greater detail.

Referring now to FIG. 7A, an embodiment of PSOC functional component 625 is depicted in greater detail. In this embodiment, PSOC functional component 625 includes an analog functional block 730, a digital functional block 740, and a programmable interconnect 750. In one exemplary implementation, analog functional block 730 includes a matrix of interconnected analog functional blocks A1 through AN. The number N may be any number of analog functional blocks. Likewise, digital block 740 includes a matrix of interconnected digital functional blocks D1 through DM. The number M may be any number of digital functional blocks.

The analog functional blocks A1 through AN and the digital functional blocks D1 through DM are fundamental building blocks (e.g., fundamental circuits) that may be combined in a variety of configurations to accomplish a variety of functions. The functional blocks are programmably configurable to perform different functions. In the present embodiment, the functional blocks include elements with changeable characteristics that can be specified according to the function to be performed (e.g., accessing a transformation, a voltage pump, and a clock). Inputs received by a functional block are directed through and manipulated by the functional block according to the specified characteristics of the elements. A combination of functional blocks and the characteristics of their elements can be dynamically programmed to perform a function. Importantly, different combinations of blocks producing different functions may exist at different times within the same system. For example, a set of functional blocks configured to perform the function of a pulse width clock for limiting the time a programming voltage is applied. After timing the voltage, some, or all of those same blocks (perhaps in conjunction with others) may be recombined in a different configuration to perform a memory erasing function.

The present invention is readily adaptable for use with numerous functional blocks that are programmably configurable to provide a variety of functions. Exemplary functional peripherals include timers, controllers, serial communications units, Cycle Redundancy Check (CRC) generators, Universal Asynchronous Receiver/Transmitters (UARTs), amplifiers, voltage pumps, programmable gain components, digital to analog converters, analog to digital converters, analog drivers, and various filters (e.g., high-, low-, and band-pass). In one exemplary implementation higher order user modules (e.g., modems, complex motor control, sensor devices, etc.) are created with combinations of functional blocks. Co-pending commonly-owned incorporated U.S. patent application Ser. No. 10/033,027, filed Oct. 22, 2001, entitled "MICROCONTROLLER PROGRAMMABLE SYSTEM ON A CHIP" includes additional details on exemplary implementations of present invention integrated circuits (e.g., integrated circuit 610) and PSOC functional components (e.g., PSOC functional component 625).

In one embodiment of the present invention, the programmable configuration of integrated circuit 610 components is facilitated by memory (e.g., configuration registers) included in the integrated circuit. In one exemplary implementation of the present invention, the memory includes configuration registers that store a series of logical values (e.g., logical 1 or 0 corresponding to a predetermined voltage level) corresponding to a particular configuration and/or function for an integrated circuit 610 functional block. The series of logic values are programmably configurable and in one embodiment of the present invention the logical values loaded in a configuration register are defined by a configuration image (e.g., stored in a system memory 617).

In one embodiment of the present invention, a PSOC functional component (e.g., PSOC functional component 625) includes registers that are programmably configurable to store configuration data that defines the combination (e.g., electrical coupling) of the functional blocks and the characteristics (e.g., parameters) of the respective functional block elements. When a value is changed in a configuration register the configuration and/or functionality of a corresponding integrated system 610 component is changed accordingly. In one exemplary implementation of the present invention, some functional blocks are configured to affect autonomous system operations, such as interrupts.

Figure 7B:
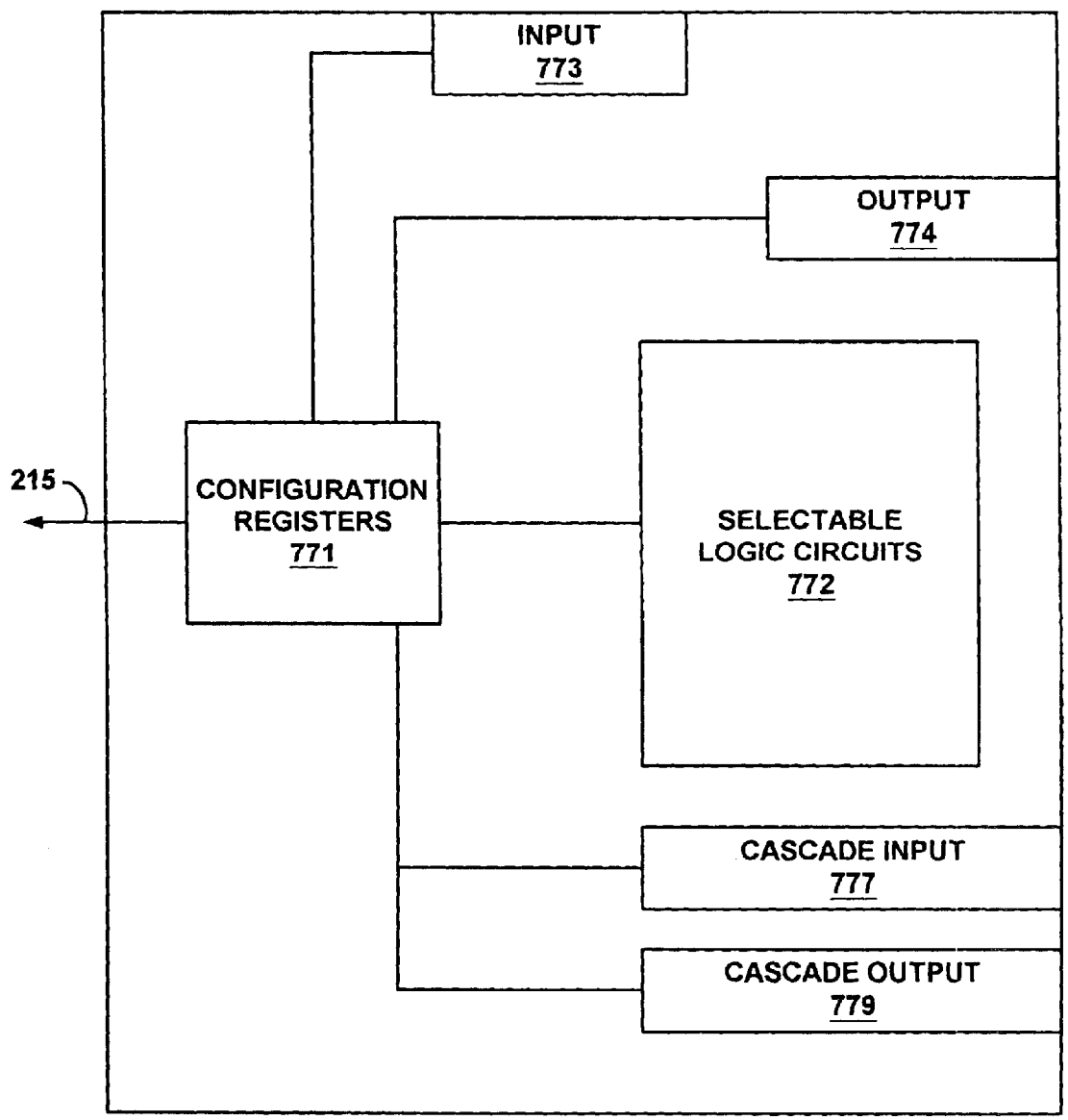
FIG. 7B is a block diagram of one embodiment of a functional block, included in one exemplary implementation of a present invention functional block.

FIG. 7B is a block diagram of functional block 770, one embodiment of a present invention functional block (e.g., A1, D1, etc.). Functional block 770 comprises configuration register(s) 771, selectable logic circuits 772, input 773, output 774, cascade input 777, and cascade output 779. Configuration register(s) 771 is coupled to selectable logic circuits 772, input 773, output 774, cascade input 777, and cascade output 779. Configuration register(s) 771 stores configuration data that defines the configuration and functionality of the other components of functional block 770. Selectable logic circuits 772 are circuit components that provide a variety of functions in accordance with the configuration data stored in configuration register(s) 771. Input 773 and output 774 provide inputs and outputs respectively to other components of integrated circuit 610 in accordance with the configuration data stored in configuration register(s) 771. Cascade input 777 and cascade output 779 provide inputs and outputs respectively to other cascaded functional blocks in accordance with the configuration data stored in configuration register(s) 771. In one embodiment there are four configuration registers per block, with a capacity of eight bits per register.

A hierarchy of programmable interconnectivity is implemented within system 610. Continuing with reference to FIG. 7A, each individual functional block or unit (e.g., analog blocks A1 through AN and digital blocks D1 through DM) may communicate and interact with each and/or any other functional block or unit and/or communication bus 215. Analog functional blocks 730 and digital functional blocks 740 are communicatively coupled to programmable interconnect 750 by intra-block routing 735 in the present exemplary embodiment. Which functional unit communicates with which other functional unit and/or communication bus 215 is programmably configurable via the programmable interconnect 750 in the present exemplary embodiment. In one exemplary implementation of the present invention, analog functional blocks 730 and digital blocks 740 include internal matrices that facilitate coupling of signals between the function blocks in accordance with programmed configuration data.

In the present exemplary embodiment, programmable interconnect 750 comprises a configuration system and a global mapping system. The configuration system is coupled to communication bus 215 and the global mapping system, which in turn is coupled to PSOC functional component 625. The configuration system is programmably configurable to selectively couple with communication bus 215 and/or the global mapping system. The global mapping system facilitates selective coupling of functional blocks included in PSOC functional component 625 to other functional blocks and/or communication bus 215. In one exemplary implementation, the global mapping system includes an input global mapping component and an output global mapping component.

In one embodiment of the present invention, programmable interconnect 750 includes configuration registers. The values in the configuration registers are utilized to establish electrically conductive paths between components of integrated circuit 610. In one exemplary implementation of the present invention the configuration registers facilitate electrical coupling of functional blocks to each other and to other components of integrated circuit 610 (e.g., processor 220).

In one embodiment of the present invention, which functional block and/or other components of integrated system 610 are electrically coupled to an I/O pin is configurably programmable via programmable interconnect 750. In the present exemplary implementation, programmable interconnect 750 is connected via an internal input/output (I/O) bus 736 to a configurable I/O port (e.g., I/O pin(s) 618 in FIG. 6). Each pin of the configurable I/O port is programmably configured on a pin by pin basis. For example, in a first configuration a first I/O port pin (e.g., I/O pin(s) 618) is configured to function as an input and a second I/O pin is configured to function as an output, and in a second configuration the first I/O port pin is configured to function as an output and the second I/O pin is configured to function as an input. The total pin count of a pin-by-pin configurable I/O port (e.g., I/O pin(s) 618) may vary from one application to another, depending on the system device under consideration. An I/O routing modality incorporating features of the present embodiment enables flexibly configurable I/O ports to establish a specific pin locale or pin for the conveyance of particular external signals (e.g., to or from an external device) on pin by pin basis, greatly enhancing user convenience and system applicability.

In one embodiment of the present invention, a system timing block is included to provide timing information used for synchronizing and otherwise effectuating interfacing between system functionalities (e.g., PSOC functional blocks). The system timing block like the PSOC functional component 625 is programmable. Advantageously, this allows the system timing block to generate a myriad of different time bases, for any particular application the system is being configured to effectuate. These time bases may be fed into analog functional blocks and digital functional blocks for use therein, via the programmable interconnect. Examples of analog functions requiring such time bases include conversions, modulations, and the like. One striking example of a digital function requiring such time bases is a universal asynchronous receiver transmitter ( WART) functionality.

In one embodiment of the present invention, the configuration and functionality of an electronic device (e.g., a PSOC component) is defined by a configuration image loaded in a memory of the electronic device (e.g., microcontroller 610). In one exemplary implementation of the present invention, a plurality of images are loaded in a memory of electronic system to facilitate dynamic reconfiguration of the electronic system (e.g., a PSOC). The information comprising the configuration image may be represented in varying degrees of abstraction. At a low level of abstraction the configuration image is represented by source code (e.g., assembly or machine language) stored as logical values (e.g., logical ones and zeroes) in a memory (e.g., in the PSOC). At a higher lever of abstraction the configuration image is represented by textual definitions or graphical images (e.g., in a design tool).

In one exemplary implementation of the present invention, a configuration image includes user module personalization data (e.g., PSOC configuration table), module parameterization data, application program interface (API) information and user program code. The user module personalization data includes information defining the functionality and configuration of a component included in a PSOC (e.g., a functional block). The parameterization data defines parameters for the PSOC component. The API defines an operation of the PSOC component (e.g., apply power, remove power, sample rate of an AC to DC converter, etc.). In one embodiment of the present invention an API includes code for a function call (e.g., from a user program) and/or an interrupt. In one exemplary implementation of the present invention, user module personalization data defines an analog function block to function as an op amp, the parameterization data defines the gain of the op amp (e.g., 8X), and the API code defines a reset of the op-amp.

A dynamically programmable electronic device (e.g., a PSOC) is programmably configurable to perform a plurality of functions for a variety of applications. Each configuration image loaded in a present invention PSOC enables the PSOC to provide a different configuration and functionality. In one exemplary implementation, a present invention PSOC device is utilized in the programming of a memory device (e.g., a flash memory). When a need to store data exists the PSOC is activated. The PSOC then receives a measurement from a temperature sensor and accesses a transformation. This allows the PSOC components to process the measurement from the temperature sensor in conjunction with the transformation to establish a programming time for the memory device as a function of programming voltage and temperature. The PSOC is activated causing the PSOC components to apply the programming voltage to the memory device for the length of time specified.

The present invention is readily adaptable to a variety of mechanisms and processes for implementing the dynamic activation of different configuration images. In one embodiment of the present invention, a first configuration image and a second configuration image include a copy of the same user program. In another embodiment, a first configuration image and a second configuration image include pointers that point to a user program and relevant information from the user program is loaded into the configuration registers when the respective image is activated.

Figure 8:
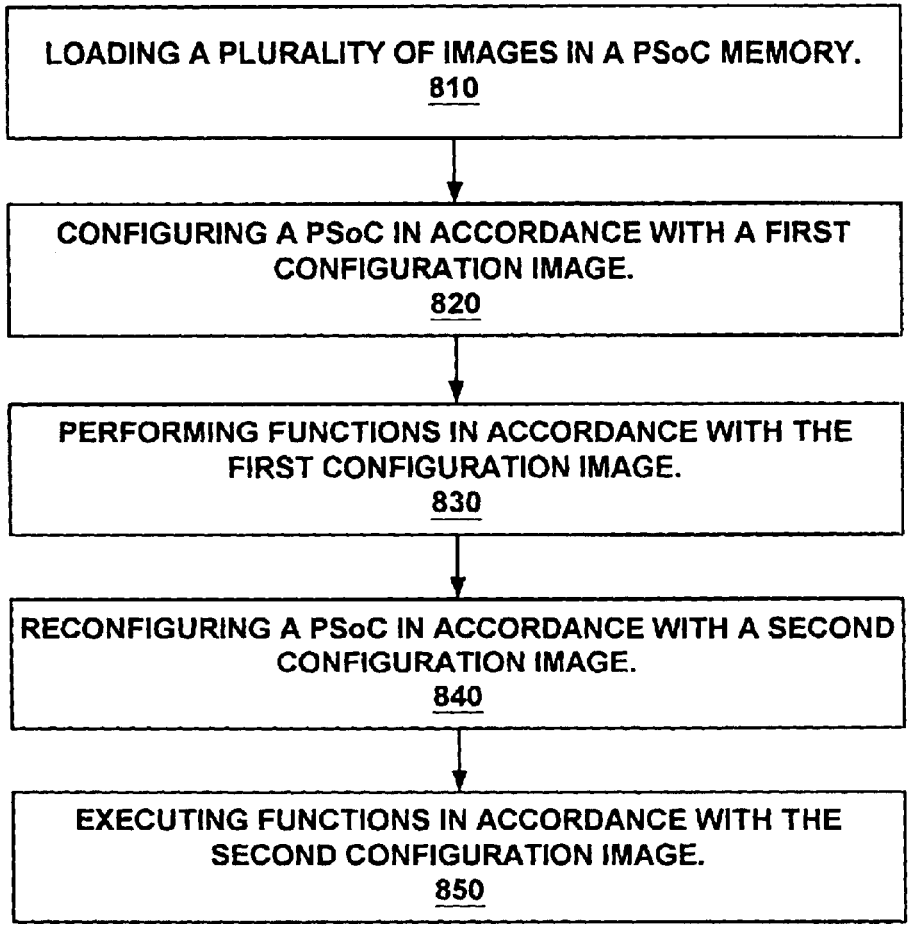
FIG. 8 is a flow chart of a PSOC dynamic configuration method, one embodiment of the present invention.

FIG. 8 is a flow chart of PSOC dynamic configuration method 800, one embodiment of the present invention. PSOC dynamic configuration method 800 facilitates dynamic configuration of a PSOC to provide different configurations and functions. In one embodiment of the present invention, PSOC dynamic configuration method 800 utilizes a plurality of configuration images loaded in a PSOC memory to facilitate different configurations and implement different functionalities. In one embodiment of the present invention, PSOC dynamic configuration method 800 facilitates configuration changes (e.g., reconfiguration) with smooth operational transitions ("on the fly") to efficiently and flexibly address differing functions or configurations of end use applications. In one embodiment of the present invention, the configuration images are provided by a design tool (e.g., a computer implemented software PSOC design tool). Additional details on an exemplary implementation of a present invention design tool are set forth in co-pending commonly-owned U.S. patent application Ser. No. 09/989,570 filed Nov. 19, 2001, entitled "METHOD FOR FACILITATING MICROCONTROLLER PROGRAMMING", which is hereby incorporated by this reference, U.S. patent application Ser. No. 09/989,819 filed Nov. 19, 2001, entitled "A SYSTEM AND METHOD FOR CREATING A BOOT FILE UTILIZING A BOOT TEMPLATE", which is also hereby incorporated by this reference, and U.S. patent application Ser. No. 09/989,817 Nov. 19, 2001, entitled "A SYSTEM AND METHOD OF DYNAMICALLY RECONFIGURING A PROGRAMMABLE SYSTEM ON A CHIP", which is also hereby incorporated by this reference.

In step 810 a plurality of configuration images are loaded in a PSOC memory using the techniques described in FIG. 4. In one exemplary implementation of the present invention, different configuration images define different functions and configurations for components of a target PSOC. In one embodiment of the present invention, two different configuration images include copies of the same user code and in another embodiment of the present invention two different configuration images included a "call" to the same user code. In one embodiment of the present invention, each configuration image includes information associated with selections of users modules for each one of the plurality of configurations images, allocations of hardware resources of the PSOC to the selected user modules, parameterizations for the selected user modules, and connections between the selected user modules and to other PSOC components (e.g., external pins).

In step 820 a PSOC is configured in accordance with a first configuration image. In one embodiment of the present invention, information from the first configuration image is automatically loaded into configuration registers in the target PSOC device. In one exemplary implementation, the first configuration image is automatically loaded into configuration registers in response to a first condition (e.g., a talk button is activated, at a particular time, etc.).

In step 830 functions are performed in accordance with a first configuration image. In one embodiment of the present invention, the first configuration image is associated with functions directed at normal or standard activities of a particular application. For example, a first image is associated with normal memory programming activities including monitoring voltage output, calculating programming time, analyzing transformations, etc.

In step 840 a PSOC is reconfigured in accordance with a second configuration image. In one embodiment of the present invention, information from a second configuration image is automatically loaded into configuration registers in the target PSOC device and replaces the information associated with the first configuration image. In one exemplary implementation, the second configuration image is automatically loaded into configuration registers in response to a second condition (e.g., a talk button is not activated, at a different particular time, etc.).

In step 850 functions are executed in accordance with a second configuration image. In one embodiment of the present invention, the second configuration image is associated with functions directed at special activities of a particular application. For example, a second image is associated with special memory programming activities including combining operation of pulse width clock and voltage pump, determining new configurations based on temperature variations, participating in memory programming operations to prepare a memory device for new data, etc.

In one embodiment of the present invention, configuration images are provided by an electronic device design tool (e.g., a PSOC design tool). FIG. 9 is a flow chart of PSOC design tool process 900 and illustrates exemplary steps used by a design tool in accordance with one embodiment of the present invention. PSOC design tool process 900 facilitates configuration, programming, building, emulation and debugging of a customized PSOC (a "target device"). In one exemplary implementation the PSOC is similar to integrated circuit 610 of FIG. 6 with a PSOC function component 625 similar to FIG. 7A.

In one embodiment, PSOC design tool process 900 is carried out by a computer system under the control of computer-readable and computer-executable instructions directed at implementing PSOC design tool process 900. One embodiment of an exemplary computer system utilized to implement PSOC design tool process 900 is set forth in incorporated U.S. patent application Ser. No. 09/989,570 filed Nov. 19, 2001, entitled "METHOD FOR FACILITATING MICROCONTROLLER PROGRAMMING". The computer-readable and computer-executable instructions reside, for example, in data storage features of the computer system such as a computer usable volatile memory, computer-usable non-volatile memory and/or data storage device. The computer-readable and computer-executable instructions direct the computer system operation (e.g., a processor) in accordance with PSOC design tool process 900.

In step 910, an interface for user interaction is provided. In one embodiment of the present invention, the interface is provided for selecting applicable "user modules" (e.g., a preconfigured function that may be based on more than one PSOC functional block). In one exemplary implementation, a user module when programmed and loaded on a memory of the PSOC directs a functional block to work as a peripheral on the target device. At any time in PSOC design tool process 900, user modules may be added to or removed from the target device. The selected user modules are associated with (e.g., "placed" or "mapped to") representations of PSOC blocks defined in the PSOC design tool. Once a user module is associated with a PSOC representation, its parameters can be viewed and modified as needed. Global parameters used by a plurality of user modules (for example, CPU clock speed) can also be set. In one embodiment of the present invention, interconnections between selected user modules are specified (e.g., either as , each user module is placed or afterwards). The pin-out for each PSOC block can also be delineated, making a connection between the software configuration and the hardware of the target PSOC device.

In step 920, application files are automatically generated. When application files are generated, existing assembly-source and C compiler code are updated for device configurations. In one embodiment of the present invention application program interfaces (APIs) and interrupt service routines (ISRs) are generated.

In step 930, programming of the functionality into the target device is facilitated. In one embodiment of the present invention, source code files can be edited, added or removed. In one embodiment of the present, programmable configuration of external PSOC ports is also facilitated by PSOC design tool process 900.

In step 940, an assembler process is executed. The assembler operates on an assembly-language source to produce executable code. This code is compiled and built into an executable file. In one embodiment of the present invention, the executable file is downloaded into an emulator, where the functionality of the target device is emulated and debugged.

In step 950 the target device is "built" within the PSOC design tool. Building the target device in the PSOC design tool includes linking the programmed functionalities of the source files (including device configuration). In one exemplary implementation of the present invention, the linked programmed functionalities and the source files are downloaded to an emulator for debugging in step 950.

In step 960, the target device is emulated using an in-circuit emulator for debugging. The emulator allows the target device to be tested in a hardware environment while device activity is viewed and debugged in a software environment.

In step 970 a configuration image generated using PSOC design tool process 900 is loaded into memory of a PSOC target device. In one embodiment of the present invention a plurality of configuration images are loaded into memory of a PSOC target device.

Although specific steps are disclosed in PSOC design tool process 900 of FIG. 9, such steps are exemplary. That is, the present invention is well suited to use with various other steps or variations of the steps recited in process 900. Additionally, for purposes of clarity and brevity, the discussion is directed at times to specific examples. The present invention PSOC design tool process 900, however, is not limited solely to use to design a particular target device (e.g., a PSOC device and/or microcontroller). Instead, the present invention is well suited to use with other types of computer-aided hardware and software design systems which may be used to accomplish a multitude of tasks as part of an overall process directed at designing an electronic device.

Thus, the present invention provides, in various embodiments, methods for programming a memory device. Embodiments of the present invention also provide a method for programming a memory device, which can calculate the most efficient programming voltage and programming time for a specific memory device. The present invention further provides a method for programming a memory device, which can proficiently utilize the memory device temperature when calculating the most efficient programming voltage and programming time for a specific memory device. The present invention also provides a method for programming a memory device, which is compatible with existing memory device programming processes.

The foregoing descriptions of specific embodiments of the present invention have been presented for purposes of illustration and description. They are not intended to be exhaustive or to limit the invention to the precise forms disclosed, and obviously many modifications and variations are possible in light of the above teaching. The embodiments were chosen and described in order to best explain the principles of the invention and its practical application, to thereby enable others skilled in the art to best utilize the invention and various embodiments with various modifications are suited to the particular use contemplated. It is intended that the scope of the invention be defined by the Claims appended hereto and their equivalents.

What is claimed is:

1. A method for programming a memory device comprising:
   accessing a temperature measurement from a temperature sensor near said memory device;
   selecting a programming voltage for said memory device based on said temperature measurement; and
   applying said programming voltage to said memory device for a length of time based on said temperature measurement to program data into said memory device.

2. The method as recited in claim 1 wherein said selecting a programming voltage further comprises:
   indexing a transformation based on said programming voltage in conjunction with said measurement from said temperature sensor to said length of time for programming said memory device.

3. The method as recited in claim 2 wherein said temperature sensor, said transformation, and said memory device are disposed within an integrated circuit.

4. The method as recited in claim 2 wherein said indexing is performed by a processor associated with said integrated circuit.

5. The method as recited in claim 4 wherein said processor is a microprocessor on a microcontroller programmable system on a chip (PSOC).

6. The method as recited in claim 2 wherein said transformation comprised a memory resident lookup table.

7. The method as recited in claim 2 wherein said transformation comprises a relationship.

8. The method as recited in claim 2 wherein said transformation is pre-programmed with information pertinent to a particular memory device.

9. The method as recited in claim 1 wherein said applying said programming voltage is performed by a voltage pump associated with said integrated circuit.

10. The method as recited in claim 1 wherein said length of time for applying said programming voltage is measured by a pulse width generator associated with said integrated circuit.

11. The method as recited in claim 1 wherein said temperature measurement is a fixed temperature value known to be the temperature of said memory device during use.

12. The method as recited in claim 1 wherein said memory device comprises a flash memory device.

13. A memory device programming system comprising:
    an integrated circuit comprising a memory device;
    a temperature sensor disposed near said integrated circuit, said temperature sensor for measuring the temperature of said memory device;
    a processor coupled to said integrated circuit, said processor using said temperature provided by said temperature sensor to establish a programming time for said memory device; and
    a circuit for applying a programming voltage to said memory device for said programming time.

14. The system of claim 13 wherein said circuit comprises a voltage pump for applying a programming voltage to said memory device.

15. The system of claim 13 wherein said circuit further comprises a pulse width generator for measuring the programming time said programming voltage is to be applied to said memory device during programming thereof.

16. The system of claim 15 wherein said pulse width generator is programmed by said processor.

17. The system of claim 13 wherein said processor utilizes a transformation of programming voltage as a function of said temperature to establish said programming time for said memory device.

18. The system of claim 17 wherein said transformation comprises a memory resident table comprising time, voltage, and temperature data for programming said memory device.

19. The system of claim 17 wherein said transformation comprises a relationship for programming said memory device.

20. The system of claim 17 wherein said transformation is programmed at the testing stage of device manufacture.

21. The system of claim 17 wherein said integrated circuit further comprises said transformation.

22. The system of claim 13 wherein said processor is a microprocessor on a microcontroller programmable system on a chip (PSOC).

23. A memory device programming system comprising:
    a programmable non-volatile memory device;
    a temperature sensor measuring the temperature near said memory device;
    a processor utilizing said temperature to obtain a programming time and a voltage for said memory device; and
    a programming circuit for applying said voltage for said programming time.

24. The system of claim 23 further comprising:
a voltage pump applying said voltage to said memory device; and
a pulse width generator applying said voltage to said memory device for said programming time.

25. The system of claim 24 wherein said processor and said memory device are disposed on separate integrated circuits.

26. The system of claim 24 wherein said voltage pump and said memory device are disposed on separate integrated circuits.

27. The system of claim 24 wherein said pulse width generator and said memory device are disposed on separate integrated circuits.

28. The system of claim 23 further comprising:
a transformation comprising time and temperature variables for programming said memory device, said processor accessing said transformation to obtain said programming voltage and said programming time for said memory device.

29. The system of claim 28 wherein said transformation is pre-programmed.

30. The system of claim 28 wherein said transformation and said memory device are disposed on separate integrated circuits.

31. The system of claim 23 wherein said memory device is a flash memory device.

32. The system of claim 23 wherein said memory device is a portion of a programmable system on a chip (PSOC).

33. The system of claim 23 wherein said temperature sensor is a fixed temperature value known to be the temperature of the memory during use.

* * * * *